US010453503B2

United States Patent
Kilmer et al.

(10) Patent No.: US 10,453,503 B2
(45) Date of Patent: *Oct. 22, 2019

(54) IMPLEMENTING DRAM ROW HAMMER AVOIDANCE

(71) Applicant: International Business Machines Corporation, Armonk, NY (US)

(72) Inventors: Charles A. Kilmer, Essex Junction, VT (US); Anil B. Lingambudi, Bangalore (IN); Warren E. Maule, Cedar Park, TX (US); Diyanesh Babu C. Vidyapoornachary, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/696,192

(22) Filed: Apr. 24, 2015

(65) Prior Publication Data

US 2016/0180900 A1 Jun. 23, 2016

Related U.S. Application Data

(63) Continuation of application No. 14/573,142, filed on Dec. 17, 2014.

(51) Int. Cl.
*G11C 7/10* (2006.01)
*G06F 13/16* (2006.01)
*G11C 11/408* (2006.01)

(52) U.S. Cl.
CPC .......... *G11C 7/103* (2013.01); *G06F 13/1668* (2013.01); *G11C 11/408* (2013.01)

(58) Field of Classification Search
None
See application file for complete search history.

(56) References Cited

U.S. PATENT DOCUMENTS

| 4,649,511 A | 3/1987 | Gdula |
| 6,317,364 B1 | 11/2001 | Guterman et al. |
| 6,654,847 B1 * | 11/2003 | Roohparvar ........ G06F 12/0607 711/100 |
| 7,320,100 B2 | 1/2008 | Dixon et al. |
| 8,423,866 B2 | 4/2013 | Dusija et al. |
| 2010/0332900 A1 | 12/2010 | Yang |
| 2014/0003173 A1 | 1/2014 | Ku |

(Continued)

OTHER PUBLICATIONS

Appendix P—List of IBM Patents or Patent Applications Treated as Related—dated May 1, 2015.

(Continued)

*Primary Examiner* — Edward J Dudek, Jr.
*Assistant Examiner* — Ralph A Verderamo, III
(74) *Attorney, Agent, or Firm* — Joan Pennington

(57) ABSTRACT

A method and apparatus for implementing row hammer avoidance in a dynamic random access memory (DRAM) in a computer system. Hammer detection logic identifies a hit count of repeated activations at a specific row in the DRAM. Monitor and control logic receiving an output of the hammer detection logic compares the identified hit count with a programmable threshold value. Responsive to a specific count as determined by the programmable threshold value, the monitor and control logic captures the address where a selected row hammer avoidance action is provided.

5 Claims, 5 Drawing Sheets

(56) References Cited

U.S. PATENT DOCUMENTS

| | | |
|---|---|---|
| 2014/0006703 A1 | 1/2014 | Bains et al. |
| 2014/0006704 A1 | 1/2014 | Greenfield et al. |
| 2014/0281206 A1* | 9/2014 | Crawford .............. G11C 11/406 711/106 |
| 2015/0109871 A1* | 4/2015 | Bains .................. G06F 13/1636 365/222 |
| 2015/0206558 A1* | 7/2015 | Ni ......................... G11C 11/408 711/106 |

OTHER PUBLICATIONS

Teledyne LeCroy—Press Release "Teledyne LeCroy Updated DDR Protocol Analyzer adds "Row Hammer" Reporting and System Memory Mapping", http://teledynelecroy.com/pressreleases/document.aspx?news Sep. 4, 2013.

* cited by examiner

IMPLEMENTING DRAM ROW HAMMER AVOIDANCE

The application is a continuation application of Ser. No. 14/573,142 filed Dec. 17, 2014.

FIELD OF THE INVENTION

The present invention relates generally to the data processing field, and more particularly, relates to a method and apparatus for implementing row hammer avoidance in a dynamic random access memory (DRAM) in a computer system.

DESCRIPTION OF THE RELATED ART

Problems occur when excessive activation commands (ACTIVATE) are repeatedly targeted at a specific row in a DRAM, which is called row hammering.

Row hammering can introduce crosstalk which could cause a bit-flip error in an adjacent row and if and when the data is corrupt, it cannot be recovered even with a refresh operation (REFRESH). Typically the cause for row hammer issues is cache to cache intervention which occurs in some known computer systems.

A need exists for an effective method and mechanism for implementing row hammer avoidance in dynamic random access memory (DRAM). It is desirable to provide such method and mechanism without substantially changing the design of the DRAM or the design of dual inline memory modules (DIMM).

SUMMARY OF THE INVENTION

Principal aspects of the present invention are to provide a method and apparatus for implementing row hammer avoidance in a dynamic random access memory (DRAM) in a computer system. Other important aspects of the present invention are to provide such method, and apparatus substantially without negative effects and that overcome many of the disadvantages of prior art arrangements.

In brief, a method and apparatus for implementing row hammer avoidance in a dynamic random access memory (DRAM) in a computer system. Hammer detection logic identifies a hit count of repeated activations at a specific row in the DRAM. Monitor and control logic receiving an output of the hammer detection logic compares the identified hit count with a programmable threshold value. Responsive to a specific count as determined by the programmable threshold value, the monitor and control logic captures the address where a selected row hammer avoidance action is provided.

In accordance with features of the invention, the selected row hammer avoidance action includes holding the mainline activates and introducing one or more read cycles to eliminate row hammering effect. After generating the required read cycles, mainline activates are allowed.

In accordance with features of the invention, the selected row hammer avoidance action includes controlling the command stream to ensure that the programmable threshold value or row hammer limit is not reached.

In accordance with features of the invention, the selected row hammer avoidance action includes triggering scrub operations over an address range based on the threshold count. The scrub operations optionally are limited to set traffic conditions identified by performance counters.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and apparatus are provided for implementing row hammer avoidance in dynamic random access memory (DRAM) in accordance with preferred embodiments.

Figure 1:
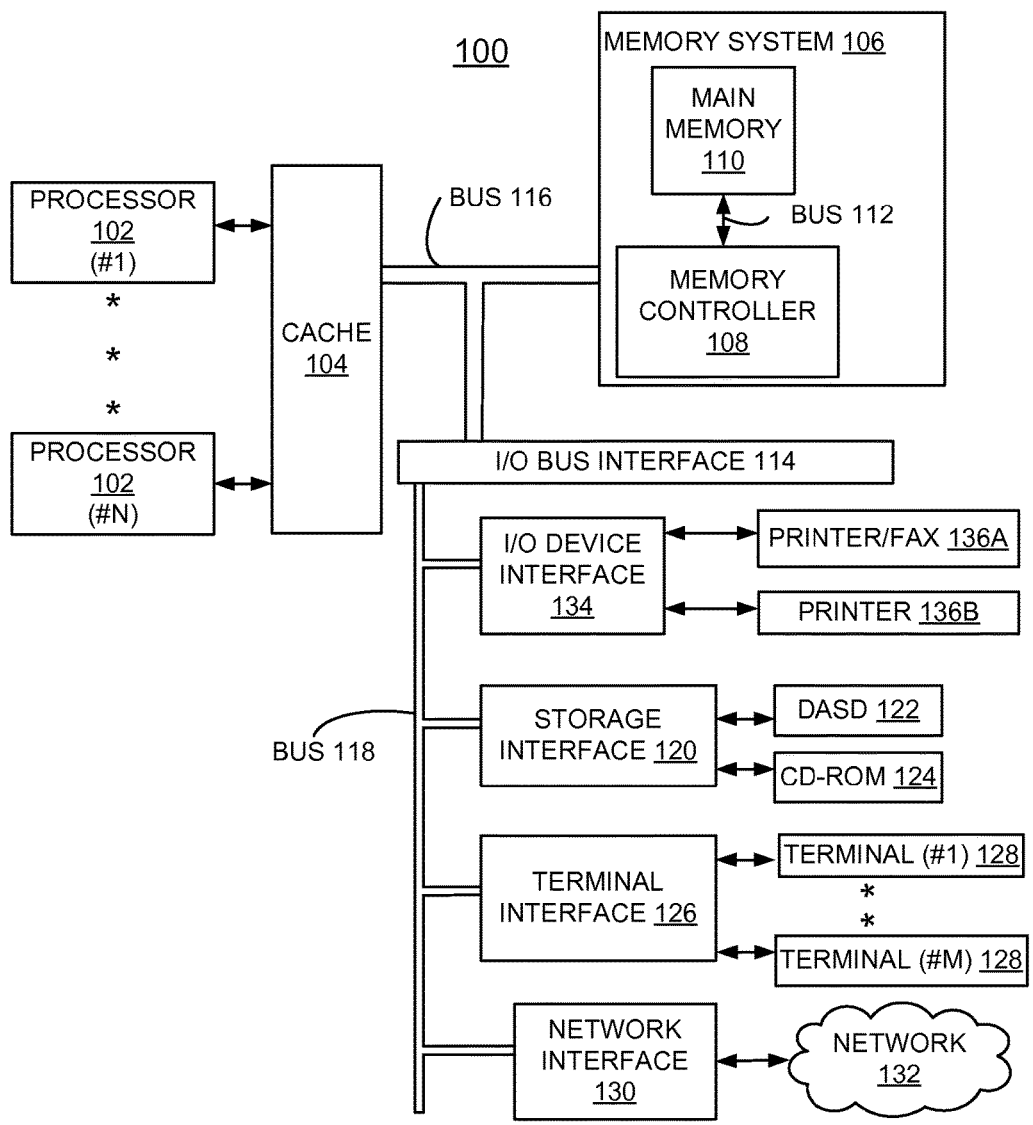
FIG. 1 is a block diagram of an example computer system embodying the present invention.

Having reference now to the drawings, in FIG. 1, there is shown a computer system embodying the present invention generally designated by the reference character 100 for implementing row hammer avoidance in dynamic random access memory (DRAM) in accordance with the preferred embodiment. Computer system 100 includes one or more processors 102 or general-purpose programmable central processing units (CPUs) 102, #1–N. As shown, computer system 100 includes multiple processors 102 typical of a relatively large system; however, system 100 can include a single CPU 102. Computer system 100 includes a cache memory 104 connected to each processor 102.

Computer system 100 includes a memory system 106 including a memory controller 108 and a main memory 110 connected by a bus 112. Bus 112 is one or more busses that send address/command information to main memory 110 and send and receive data from the memory 110. Main memory 110 is a random-access semiconductor memory for storing data, including programs. Main memory 110 is comprised of, for example, a dynamic random access memory (DRAM), a synchronous direct random access memory (SDRAM), a current double data rate (DDRx) SDRAM, non-volatile memory, optical storage, and other storage devices.

I/O bus interface 114, and buses 116, 118 provide communication paths among the various system components. Bus 116 is a processor/memory bus, often referred to as front-side bus, providing a data communication path for transferring data among CPUs 102 and caches 104, memory controller 108 and I/O bus interface unit 114. I/O bus interface 114 is further coupled to system I/O bus 118 for transferring data to and from various I/O units.

As shown, computer system 100 includes a storage interface 120 coupled to storage devices, such as, a direct access storage device (DASD) 122, and a CD-ROM 124. Computer system 100 includes a terminal interface 126 coupled to a plurality of terminals 128, #1–M, a network interface 130 coupled to a network 132, such as the Internet, local area or other networks, and a I/O device interface 134 coupled to I/O devices, such as a first printer/fax 136A, and a second printer 136B.

I/O bus interface 114 communicates with multiple I/O interface units 120, 126, 130, 134, which are also known as I/O processors (IOPs) or I/O adapters (IOAs), through system I/O bus 116. System I/O bus 116 is, for example, an industry standard PCI bus, or other appropriate bus technology.

Computer system 100 is shown in simplified form sufficient for understanding the present invention. The illustrated computer system 100 is not intended to imply architectural or functional limitations. Although main memory 110 of main memory system 106 is represented conceptually in FIG. 1 as a single entity, it will be understood that in fact the main memory is more complex. In particular, main memory system 106 comprises multiple modules and components. The present invention can be used with various hardware implementations and systems and various other internal hardware devices.

Figure 2:
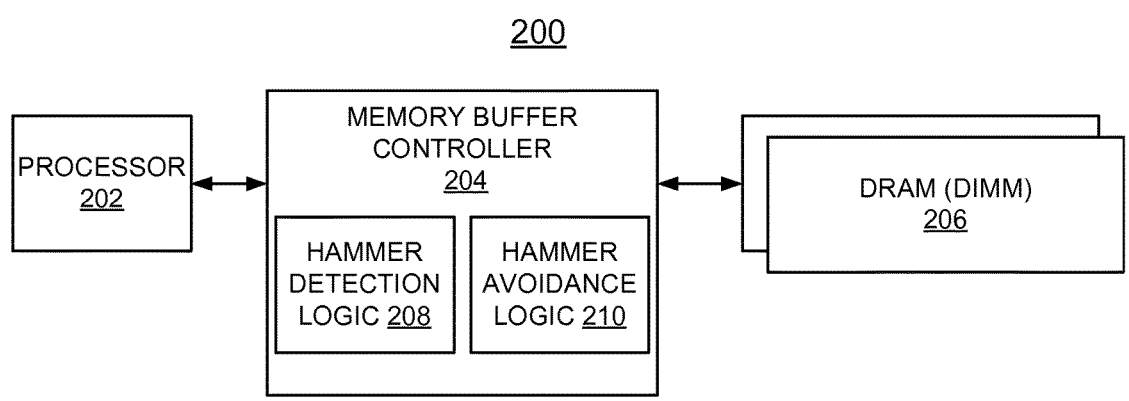
FIG. 2 is a block diagram illustrating another example computer system for implementing row hammer avoidance in a dynamic random access memory (DRAM) in accordance with preferred embodiments.

Another example computer system is illustrated and described with respect to FIG. 2 for implementing row hammer avoidance in accordance with embodiments of the invention.

Referring now to FIG. 2 there is shown an example computer system generally designated by the reference character 200 for implementing row hammer avoidance in dynamic random access memory (DRAM) in accordance with the preferred embodiment. Computer system 200 includes a processor 202 coupled by a memory buffer controller 204 to a dynamic random access memory (DRAM) 206, such as dual in line memory modules (DIMM). Memory buffer controller 204 includes hammer detection logic 208 and hammer avoidance logic 210 in accordance with embodiments of the invention.

Figure 3:
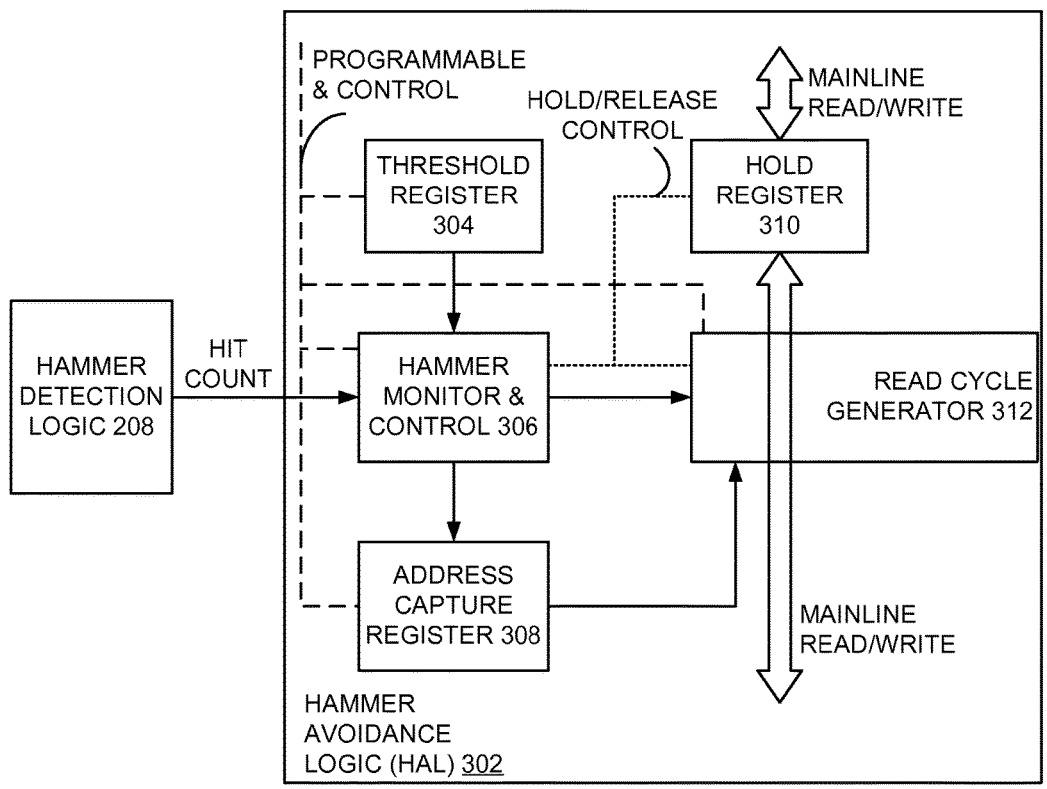
FIGS. 3 and 4 illustrate example row hammer detection logic and respective example row hammer avoidance logic for implementing row hammer avoidance in a dynamic random access memory (DRAM) in accordance with preferred embodiments.
Figure 4:
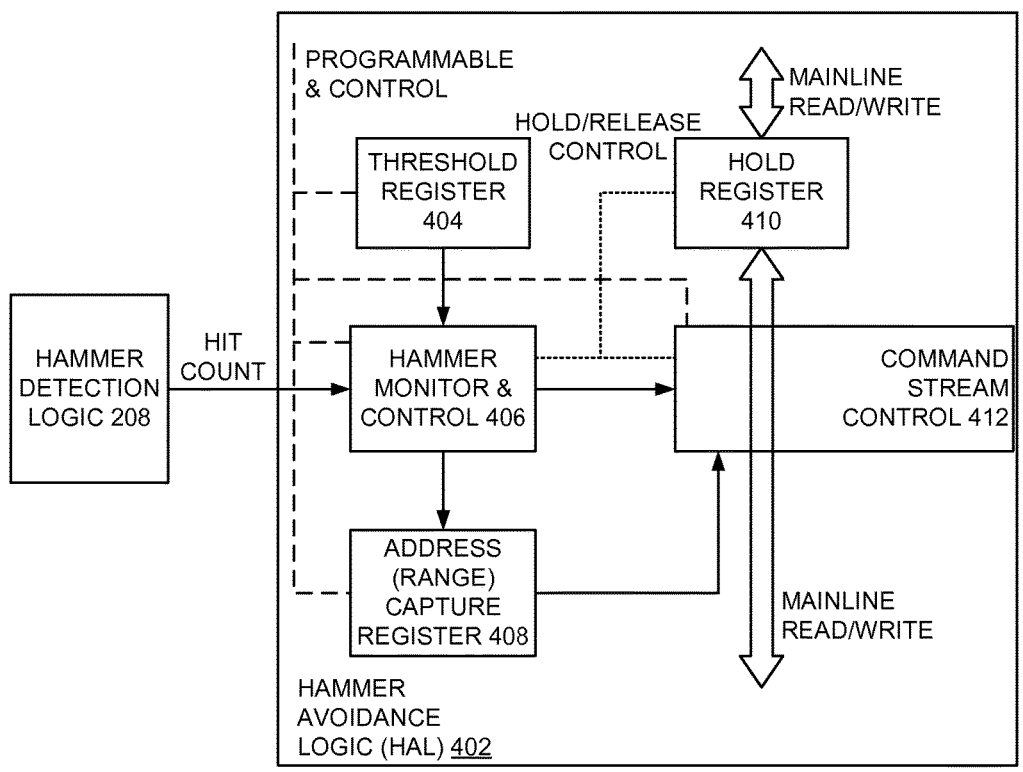

Referring now to FIGS. 3 and 4 illustrate a respective example controller including row hammer detection logic and respective example row hammer avoidance logic for implementing row hammer avoidance in a dynamic random access memory (DRAM) in accordance with preferred embodiments.

In FIG. 3, a controller generally designated by the reference character 300 includes hammer detection logic 208 and hammer avoidance logic (HAL) 302 for implementing row hammer avoidance in a dynamic random access memory (DRAM) in accordance with preferred embodiments.

In accordance with features of the invention, hammer avoidance logic (HAL) 302 prevents excessive repeated activate cycles by introducing dummy read cycles based on a predetermined threshold value. Hammer avoidance logic (HAL) 302 include a threshold register 304 that is programmed for a specific threshold value. Hammer avoidance logic (HAL) 302 include a hammer monitor and control block 306 coupled to an output of the hammer detection logic 208 monitoring the required attributes (hit count) from the detection logic. The hammer monitor and control block 306 is coupled to the threshold register 304 for comparing hit count with the programmed threshold value. Once a specific count as determined by threshold value is reached, the hammer monitor and control block 306 captures the address where the dummy read cycles have to be introduced. The hammer monitor and control block 306 is coupled to an address capture register 308 for storing the captured address. Hammer avoidance logic (HAL) 302 include a hold register 310 holding the mainline activates until at least one read cycle is provided. Hammer avoidance logic (HAL) 302 include a read cycle generator 312 introduces one or more read cycles to eliminate hammering effect. After generating required read cycles, hammer monitor and control block 306 allows the mainline read and write to activate releasing the hold register 310.

In FIG. 4, another controller generally designated by the reference character 400 includes hammer detection logic 208 and hammer avoidance logic (HAL) 402 for implementing row hammer avoidance in a dynamic random access memory (DRAM) in accordance with preferred embodiments.

In accordance with features of the invention, hammer avoidance logic (HAL) 402 prevents excessive repeated activate cycles by controlling the command stream to ensure that the predetermined threshold value or row hammer limit is not reached. Hammer avoidance logic (HAL) 402 include a threshold register 404 that is programmed for a specific threshold value. Hammer avoidance logic (HAL) 402 include a hammer monitor and control block 406 coupled to an output of the hammer detection logic 208 monitoring the required attributes (hit count) from the detection logic 208. The hammer monitor and control block 406 is coupled to the threshold register 404 for comparing hit count with the programmed threshold value. Once a specific count below the threshold value is reached, the hammer monitor and control block 406 captures the address for providing the control command stream. The hammer monitor and control block 408 is coupled to an address capture register 408 for storing the captured address.

A hold register 410 holds the mainline activates until the control command stream is provided by a command stream control 412 to eliminate hammering effect. After the control command stream is provided, hammer monitor and control block 406 allows the mainline read and write to continue releasing the hold register 410.

In accordance with features of the invention, hammer avoidance logic 402 optionally uses the command stream control 412 for triggering scrub operations over the address range based on the threshold count. This implementation can potentially be leveraged in situations, where the traffic conditions are moderate as dictated by performance counters (not shown) included with the controller 400.

Figure 5:
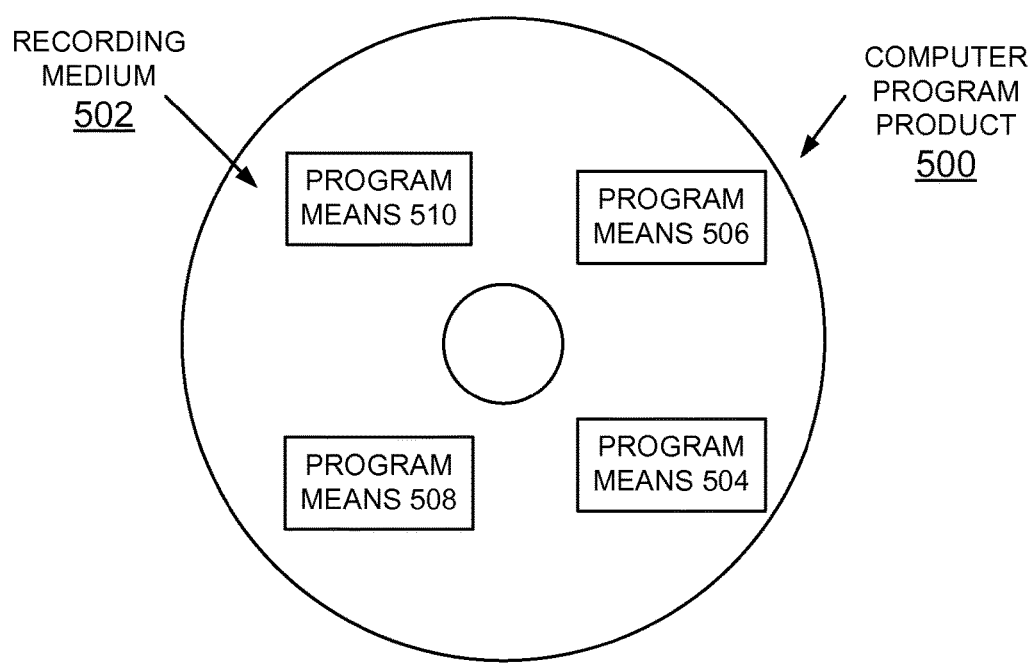
FIG. 5 is a block diagram illustrating a computer program product in accordance with the preferred embodiment.

Referring now to FIG. 5, an article of manufacture or a computer program product 500 of the invention is illustrated. The computer program product 500 is tangibly embodied on a non-transitory computer readable storage medium that includes a recording medium 502, such as, a floppy disk, a high capacity read only memory in the form of an optically read compact disk or CD-ROM, a tape, or another similar computer program product. Recording medium 502 stores program means 504, 506, 508, and 510 on the medium 502 for carrying out the methods for row hammer avoidance in dynamic random access memory (DRAM) in system 100 of FIG. 1 and system 200 of FIG. 2.

A sequence of program instructions or a logical assembly of one or more interrelated modules defined by the recorded program means 504, 506, 508, and 510, direct the computer system 200 for implementing row hammer avoidance in a dynamic random access memory (DRAM).

While the present invention has been described with reference to the details of the embodiments of the invention shown in the drawing, these details are not intended to limit the scope of the invention as claimed in the appended claims.

What is claimed is:

1. A method for implementing row hammer avoidance in a dynamic random access memory (DRAM) in a computer system comprising:

providing hammer detection logic identifying a hit count value of repeated activations at a specific row in the DRAM;

providing monitor and control logic including a threshold register storing a programmable threshold value, receiving an output of the hammer detection logic for comparing the identified hit count value with said programmable threshold value, capturing an address responsive to the compared values and providing a selected row hammer avoidance action for the captured address, said selected row hammer avoidance action including responsive to the compared values providing a command stream control for the captured address holding mainline activates to ensure that a row hammer limit is not reached, wherein providing the selected row hammer avoidance action for the captured address includes holding mainline activates over an address range of the captured address, generating dummy read cycles for the captured address, said command stream control holding mainline read and write activates until at least one dummy read cycle is generated, eliminating row hammering effect and then allowing mainline read and write to activate.

2. The method as recited in claim 1 wherein providing the selected row hammer avoidance action for the captured address includes triggering scrub operations over an address range of the captured address based on the programmable threshold value.

3. The method as recited in claim 1 wherein providing said monitor and control logic includes providing an address capture register for storing an address range of the captured address.

4. The method as recited in claim 1 wherein providing said monitor and control logic includes providing a hold register for holding and releasing mainline read and write operations.

5. The method as recited in claim 1 wherein providing said monitor and control logic includes providing a read cycle generator for generating one or more dummy read cycles for the captured address to eliminate hammering effect.

* * * * *